United States Patent [19]
Kim

[11] Patent Number: 5,903,179
[45] Date of Patent: May 11, 1999

[54] DATA-OUTPUTTING BUFFER CIRCUIT

[75] Inventor: Dong Gyeun Kim, Chungcheongbuk-do, Rep. of Korea

[73] Assignee: LG Semicon Co., Ltd., Chungcheongbuk-Do, Rep. of Korea

[21] Appl. No.: 08/953,512

[22] Filed: Oct. 17, 1997

[30]        Foreign Application Priority Data

Apr. 7, 1997 [KR]    Rep. of Korea ...................... 97/12742

[51] Int. Cl.$^6$ ....................................................... H03K 5/08
[52] U.S. Cl. ........................... 327/309; 326/86; 327/108; 327/389; 327/427
[58] Field of Search ................................. 326/80, 81, 86; 327/108, 109, 110, 111, 112, 309, 310, 313, 317, 318, 319, 328, 333, 365, 379, 389, 423, 424, 427

[56]                  References Cited

U.S. PATENT DOCUMENTS 4,678,950   7/1987   Mitake ..................................... 307/550

*Primary Examiner*—Timothy P. Callahan
*Assistant Examiner*—Jeffrey Zweizig
*Attorney, Agent, or Firm*—Morgan, Lewis & Bockius LLP

[57]             ABSTRACT

Data-outputting buffer circuit suitable for reducing noise which is generated in an output buffer circuit part when minus electric filed is applied to a data output pad in inputting data is disclosed, including a noise generation restraining part detecting a level of a signal applied to an input/output pad inputting and outputting data for outputting first and second noise generation restraining signals, a pullup transistor having a source connected to the input/output pad and a drain electrode connected to a power voltage terminal, a pulldown transistor serially connected to the pullup transistor with both sources of the pullup and pulldown transistors connected to the input/output pad, first and second driving parts for driving the pullup transistor and the pulldown transistor, and a clamp transistor turned on by the first noise generation restraining signal for restraining increase of substrate bias due to voltage difference between a gate and the source of the pullup transistor.

7 Claims, 2 Drawing Sheets

DATA-OUTPUTTING BUFFER CIRCUIT

BACKGROUND OF THE INVENTION

1. Field of the Invention

The present invention relates to data-outputting buffer circuits and, more particularly, to data-outputting buffer circuits suitable for reducing noise which is generated in an output buffer circuit part when minus electric filed is applied to a data output pad in inputting data.

2. Discussion of the Related Art

Buffer is a temporary memory spot where data are received and transmitted between two apparatuses or two programs having different rates and different units for processing data. It functions as a gate delaying signal transmission in logic circuits temporarily.

In semiconductor memory devices, a data-outputting buffer circuit serves to output data read from a memory cell to an external chip. Applied to semiconductor memory devices with high integration and high speed operations, it accompanies noise in operation of outputting data. One of main reasons for noise is big peak current which is generated when a big-sized transistor placed in output terminal of the data-outputting buffer circuit performs shift operation.

A conventional data-outputting buffer circuit will be discussed with reference to the accompanying drawings.

As shown in FIG. 1, a conventional data-outputting buffer circuit is structured to include a pullup transistor 2 and a pulldown transistor 3 which are serially connected to each other and have both source and drain connected to an input/output pad 1, a clamp transistor 4 having a gate electrode connected to a Vss terminal and a drain electrode connected to the gate electrode of the pullup transistor 2, a first driving part 5 composed of a PMOS M5 and an NMOS M4 serially connected to each other, and connected to the pullup transistor 2 through a noise-reducing resistor R1 for driving the pullup transistor 2, a second driving part 6 connected to the gate electrode of the pulldown transistor 3 through a noise-reducing resistor R2 for driving the pulldown transistor 3, and an input buffer 7 connected to the input/output pad 1 for inputting data.

The drain electrode of the pullup transistor 2 is connected to the Vcc terminal and the source electrode of the clamp transistor 4 is connected to both the input/output pad 1 and the drain electrode of the pulldown transistor 3. The second driving part 6 is composed of an inverter for inverting DOUT signals and then applying them to the pulldown transistor 3.

A data-outputting buffer circuit having the foregoing structure uses the input/output pad 1 for both inputting and outputting data.

When a data of a low level, that is, 0.8 –1V as for a fDRAM, is applied through the input/output pad 1, minus electric field is applied so that a voltage is generated between the gate electrode and source electrode of the pullup transistor (M2) 2. It is because the gate electrode of the pullup transistor 2 has ground potential GND. If the gate and source voltage of the pullup transistor 2 is bigger than $V_T$, the pullup transistor 2 is turned on. At this time, since big is the difference of the voltages of the source and drain of the pullup transistor 2, there is generated hot carrier in a channel region so that current flows toward substrate potential $V_{BB}$ of the pullup transistor 2 to heighten the potential of the substrate bias. The clamp transistor 4 serves to prevent the increase of the potential of the substrate bias.

Since the output buffer should keep high impedance while data is being transmitted or received, the gate electrodes of the pullup and pulldown transistors 2 and 3 should keep the ground potential GND. In other words, the DOUT signal keeps a high level.

When the clamp transistor 4, turned on by minus potential applied to the input/output pad 1, discharges charge accumulated in the gate electrode of the pullup transistor 2 toward the input/output pad 1, the charge is again supplied from the source electrode of the first driving part 5 to the gate electrode of the pullup transistor 2, thereby generating noise. To restrain noise, a resistor R1 serves to reduce noise.

Since potential difference between the gate and source of the pullup transistor 2 can be reduced when the level of minus voltage of the input/output pad 1 is declined to the threshold voltage of the clamp transistor 4, temporary turn-on of the pullup transistor 2 can not be prevented.

When the clamp transistor 4, turned on by minus potential applied to the input/output pad 1, discharges charge accumulated in the gate electrode of the pullup transistor 2 toward the input/output pad 1, the charge is again supplied from the source electrode of the NMOS M4 of the first driving part 5 to the gate electrode of the pullup transistor 2 so that the resistor R1 delays the charge accumulating time of the gate electrode of the pullup transistor 2 in outputting data, thereby causing the delay of pull-up operation. Therefore, there can not be effectively refrained noise which is generated by the increase of potential of the substrate bias generated due to a big difference between the drain and source of the pullup transistor 2.

SUMMERY OF THE INVENTION

Therefore, the present invention is directed to data-outputting buffer circuits that substantially obviates one or more of the problems due to limitations and disadvantages of the related art.

An object of the invention is to provide a data-outputting buffer circuit suitable for effectively refraining noise generated when minus potential is applied to a data input/output pad.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a data-outputting buffer circuit includes a noise-generation restraining part detecting a level of a signal applied to an input/output pad inputting and outputting data for outputting first and second noise generation restraining signals, a pullup transistor having a source connected to the input/output pad and a drain connected to a Vcc terminal, a pulldown transistor serially connected to the pullup transistor with both sources of the pullup and pulldown transistors connected to the input/output pad, first and second driving parts for driving the pullup transistor and the pulldown transistor, and a clamp transistor turned on by the first noise generation restraining signal for restraining increase of substrate bias by voltage difference between the gate and source of the pullup transistor.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Figure 1:
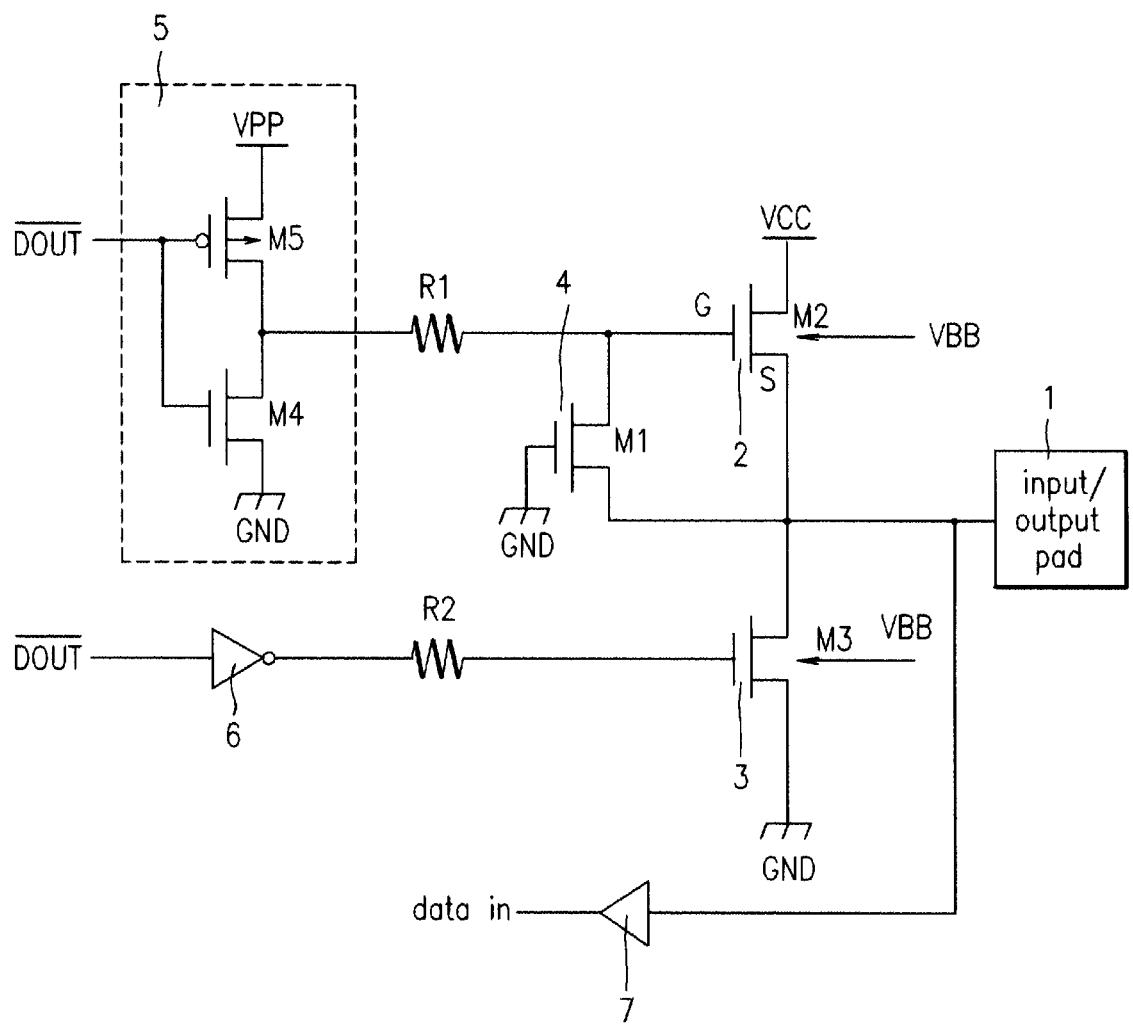
FIG. 1 is a circuit diagram of a conventional data-outputting buffer circuit.
Figure 2:
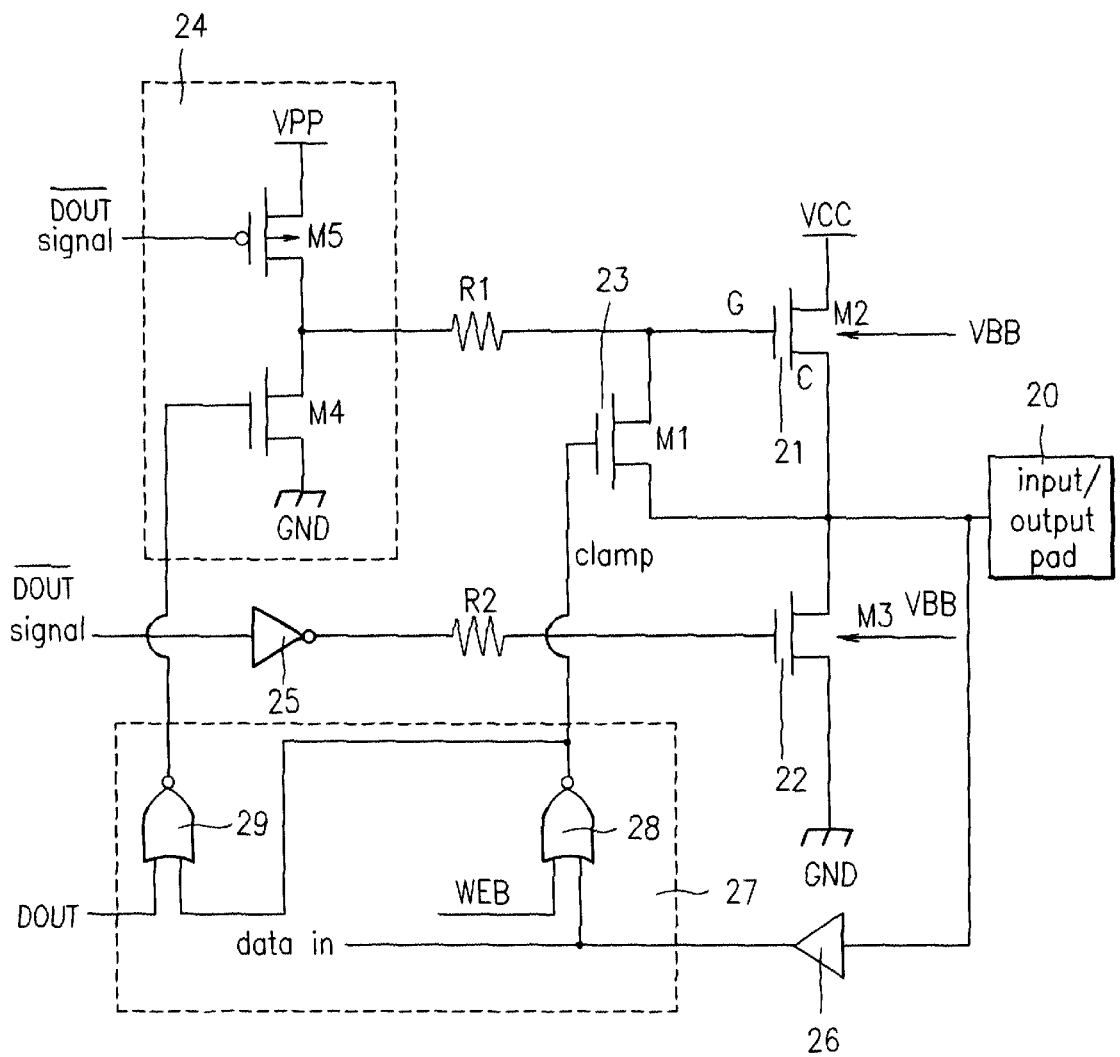
FIG. 2 is a circuit diagram of a data-outputting buffer circuit according to present invention.

Reference will now be made in detail to the preferred embodiments of the present invention, examples of which are illustrated in the accompanying drawings.

A data-outputting buffer circuit includes a pullup transistor 21 and a pulldown transistor 22 which are serially connected to each other with both their sources and drains commonly connected to the input/output pad 20, a noise generating restraining part 27 for logically operating data signals and write enable signals WEBs to generate a noise restraining signal, a clamp transistor 23 having a gate electrode connected to the noise generating restraining part 27 and a gate electrode of the pullup transistor 21, a first driving part 24 composed of a PMOS M5 and an NMOS M4 connected serially to each other, and connected to the gate electrode of the pullup transistor 21 through a noise-reducing resistor R1 for driving the pullup transistor 21, and a second driving part 25 connected to the gate electrode of the pulldown transistor 22 through a noise-reducing resistor R2 for driving the pulldown transistor 22, and an input buffer connected to the input/output pad 20 for inputting data.

The noise generation restraining part 27 includes a first NOR gate 28 logically operating a writing enable signal WEB and a data signal through the input/output pad 20 for outputting the result to the gate electrode of the clamp transistor 23 and a second NOR gate 29 logically operating an output signal of the first NOR gate 28 and an external DOUT signal for outputting the result to the gate electrode of the NMOS M4 of the first driving part 24.

The drain electrode of the pullup transistor 21 is connected to a Vcc terminal, the source electrode of the clamp transistor 23 is connected to both the input/output pad 20 and the drain electrode of the pulldown transistor 22. The second driving part 25 is composed of an inverter for inverting a DOUT signal to apply the inverted DOUT signal to the pulldown transistor 22.

The operation of the data-outputting buffer circuit having the foregoing structure will be discussed in detail. When a data of a low level whose value is between 0.8 and –1V is applied to the input/output pad 20, a signal data in passing through the input buffer 26 becomes 0V that is a low level of the CMOS device. In this time, it means that the low level has a minus value with regard to the standard ground potential. Since the signal WEB is in writing operation, the low level of 0V is maintained, and an output value of the first NOR gate 28 becomes a high level Vcc. If a signal of the high level of the first NOR gate 28 is applied to the gate electrode of the clamp transistor 23 so that the clamp transistor is completely turned on, the voltage difference between the gate and the source of the pullup transistor 21 becomes 0, thereby restraining the generation of noise due to the voltage difference between the gate and the source.

At this time, the output signal of the high level of the first NOR gate 28 and the signal of the low level of the DOUT signal are inputted so that the second NOR gate 29 outputs a signal of a low level to turn off the NMOS M4 of the first driving part 24, and the flow of charge provided for the pullup transistor 21 through the NMOS M4 can be prevented. Accordingly, the resistance of the noise reducing resistor R1 can be small, thereby heightening the speed of the pullup operation in outputting data.

The data-outputting buffer circuit has advantages. The circuit detect that data applied to an input/output pad falls to a low level, so as to turn on a clamp transistor, whereby noise generated by a voltage difference between gate and source of a pullup transistor by applying minus potential to an input/output pad can be restrained. An NMOS M4 of a driving part of the pullup transistor is turned off so that ground potential of the driving part of the pullup transistor can be prevented from flowing to the pullup transistor. Consequently, performance of outputting data can be effectively improved. Furthermore, the resistance of a noise-reducing resistor placed between the driving parts of the pullup transistor and the pulldown transistor can be declined to enhance the speed of pullup of the data-outputting buffer circuits.

It will be apparent to those skilled in the art that various modification and variations can be made in the data-outputting buffer circuits of the present invention without departing from the spirit or scope of the inventions. Thus, it is intended that the present invention cover the modifications and variations of this invention provided they come within the scope of the appended claims and their equivalents.

What is claimed is:

1. A data-outputting buffer circuit comprising:
   a noise generation restraining part detecting a level of a signal applied to an input/output pad inputting and outputting data for outputting first and second noise generation restraining signals;
   a pullup transistor having a source connected to the input/output pad and a drain electrode connected to a power voltage terminal;
   a pulldown transistor serially connected to the pullup transistor with both sources of the pullup and pulldown transistors connected to the input/output pad;
   first and second driving parts for driving the pullup transistor and the pulldown transistor; and
   a clamp transistor turned on by the first noise generation restraining signal for restraining increase of substrate bias due to voltage difference between a gate and the source of the pullup transistor.

2. The data-outputting buffer circuit as claimed in claim 1, wherein the first driving part is composed of a PMOS M5 having a source connected to a Vpp terminal and an NMOS M4 having a source connected to a ground terminal to be turned off by the second noise generation restraining signal and drains of the PMOS and NMOS are connected to the gate of the pullup transistor.

3. The data-outputting buffer circuit as claimed in claim 1, wherein the second driving part is composed of an inverter for inverting a DOUT signal for outputting the inverted DOUT signal to the gate of the pulldown transistor.

4. The data-outputting buffer circuit as claimed in claim 1, wherein a noise-reducing resistor R1 is formed between the first driving part and the gate of the pullup transistor, and a noise-reducing resistor R2 is formed between the second driving part and the gate of the pulldown transistor.

5. The data-outputting buffer circuit as claimed in claim 1, wherein the noise generation restraining part comprises:

a first NOR gate logically operating a write enable signal WEB and a data signal through the input/output pad for outputting the first noise generation restraining signal; and a second NOR gate logically operating an output signal of the first NOR gate and the DOUT signal for outputting the second noise generation restraining signal.

6. The data-outputting buffer circuit as claimed in claim 1, wherein the clamp transistor has a source connected to the input/output pad and a drain connected to both the gate of the pullup transistor and an output terminal of the first driving part through the noise-reducing resistor R1.

7. The data-outputting buffer circuit as claimed in claim 1, wherein if minus potential of a lower level than a standard ground voltage is applied to the input/output pad, the noise generation restraining part detects the minus potential and then outputs the first noise generation restraining signal of a high level so as to turn on the clamp transistor, and the second noise generation restraining signal so as to turn off the NMOS M4 of the first driving part.

* * * * *